(12) United States Patent
Beach et al.

(10) Patent No.: US 9,735,350 B2
(45) Date of Patent: Aug. 15, 2017

(54) METHOD AND SYSTEM FOR REMOVING BORON FROM MAGNETIC JUNCTIONS USABLE IN SPIN TRANSFER TORQUE MEMORY APPLICATIONS

(71) Applicant: Samsung Electronics Co., LTD., Gyeonggi-do (KR)

(72) Inventors: Robert Beach, San Jose, CA (US); Roman Chepulskyy, Milpitas, CA (US); Dustin William Erickson, Morgan Hill, CA (US); Vladimir Nikitin, Campbell, CA (US)

(73) Assignee: SAMSUNG ELECTRONICS CO., LTD., Gyeonggi-Do (KR)

(*) Notice: Subject to any disclaimer, the term of this patent is extended or adjusted under 35 U.S.C. 154(b) by 0 days.

(21) Appl. No.: 14/981,107

(22) Filed: Dec. 28, 2015

(65) Prior Publication Data
US 2016/0197270 A1 Jul. 7, 2016

Related U.S. Application Data

(60) Provisional application No. 62/099,863, filed on Jan. 5, 2015.

(51) Int. Cl.
*H01L 43/02* (2006.01)
*H01L 43/12* (2006.01)
(Continued)

(52) U.S. Cl.
CPC .............. *H01L 43/12* (2013.01); *H01L 43/02* (2013.01); *H01L 43/08* (2013.01); *H01L 43/10* (2013.01)

(58) Field of Classification Search
CPC ......... H01L 43/12; H01L 43/10; H01L 43/08; H01L 43/02
See application file for complete search history.

(56) References Cited

U.S. PATENT DOCUMENTS 7,820,455 B2  10/2010  Gill
8,513,752 B2  8/2013  Peng
(Continued)

OTHER PUBLICATIONS

Kamali, "Oxidation states and the quality of lower interfaces in magnetic tunnel junctions: Oxygen effect on crystallization of interfaces," Journai of Physics Condensed Matter, v 25, n 13, Institute of Physics Publishing, Apr. 3, 2013.
(Continued)

*Primary Examiner* — Kyoung Lee
*Assistant Examiner* — Christina Sylvia
(74) *Attorney, Agent, or Firm* — Convergent Law Group LLP

(57) ABSTRACT

A method provides a magnetic junction having a top and sides. A first magnetic layer, a nonmagnetic spacer layer and a second magnetic layer are deposited. The nonmagnetic spacer layer is between the first and second magnetic layers. A free layer is one of the magnetic layers. A reference layer is the other of the magnetic layers. The second magnetic layer includes an amorphous magnetic layer having nonmagnetic constituent(s) that are glass-forming. An anneal is performed in a gas having an affinity for the nonmagnetic constituent(s). The gas includes at least one of first and second gases. The first gas forms a gaseous compound with the nonmagnetic constituent(s) The second gas forms a solid compound with the nonmagnetic constituent(s). The second gas is usable if the anneal is performed after the magnetic junction has been defined. The solid compound is at least on the sides of the magnetic junction.

15 Claims, 9 Drawing Sheets

(51) Int. Cl.
H01L 43/08 (2006.01)
H01L 43/10 (2006.01)

(56) References Cited

U.S. PATENT DOCUMENTS

| | | |
|---|---|---|
| 8,545,999 B1 | 10/2013 | Leng |
| 8,604,572 B2 | 12/2013 | Wang |
| 2008/0299679 A1 | 12/2008 | Zhao |
| 2011/0188157 A1 | 8/2011 | Zhao |
| 2012/0299132 A1 | 11/2012 | Lin |
| 2013/0028013 A1 | 1/2013 | Ikeda |
| 2014/0087485 A1 | 3/2014 | Tomioka |
| 2014/0154529 A1 | 6/2014 | Yang |
| 2015/0069543 A1* | 3/2015 | Nagamine ............... H01L 43/02 257/421 |

OTHER PUBLICATIONS

Komagaki, "Influence of diffused boron into MgO barrier on pinhole creation in CoFeB/MgO/CoFeB magnetic tunnel junctions," IEEE, 45, n 10, 3453-6, Oct. 2009.

Kozina, "A nondestructive analysis of the B diffusion in Ta—CoFeB—MgO—CoFeB—Ta magnetic tunnel junctions by hard x-ray photoemission," Applied Physics Letters, vo. 96, No. 7.

Schreiber, "Effects of elemental distributions on the behavior of MgO-based magnetic tunnel junctions," journal of Applied Physics, vol. 109, No. 10, May 15, 2011.

* cited by examiner

200

| Amorphous Layer (CoFeB) | 234 |
| --- | --- |
| Optional Layer(s) | 232 |
| Nonmagnetic Spacer Layer | 220 |
| First Magnetic Layer (Optionally Multilayer) 210 | |
| Optional Seed Layer(s) | 202 |
| Substrate | 201 |

}- 230 (brackets layers 232, 234)

| Opt'l Additional Layer(s) | 240 |
| --- | --- |
| Amorphous Layer (CoFeB) | 234 |
| Optional Layer(s) | 232 |
| Nonmagnetic Spacer Layer | 220 |
| First Magnetic Layer (Optionally Multilayer) 210 | |
| Optional Seed Layer(s) | 202 |
| Substrate | 201 |

}- 230 (brackets layers 232, 234)

FIG. 4

METHOD AND SYSTEM FOR REMOVING BORON FROM MAGNETIC JUNCTIONS USABLE IN SPIN TRANSFER TORQUE MEMORY APPLICATIONS

CROSS-REFERENCE TO RELATED APPLICATIONS

This application claims the benefit of provisional Patent Application Ser. No. 62/099,863, filed Jan. 5, 2015, entitled BORON REMOVAL, assigned to the assignee of the present application, and incorporated herein by reference.

BACKGROUND OF THE INVENTION

Magnetic memories, particularly magnetic random access memories (MRAMs), have drawn increasing interest due to their potential for high read/write speed, excellent endurance, non-volatility and low power consumption during operation. An MRAM can store information utilizing magnetic materials as an information recording medium. One type of MRAM is a spin transfer torque random access memory (STT-MRAM). STT-MRAM utilizes magnetic junctions written at least in part by a current driven through the magnetic junction. A spin polarized current driven through the magnetic junction exerts a spin torque on the magnetic moments in the magnetic junction. As a result, layer(s) having magnetic moments that are responsive to the spin torque may be switched to a desired state.

For example, FIG. 1 depicts a conventional magnetic tunneling junction (MTJ) 10 as it may be used in a conventional STT-MRAM. The conventional MTJ 10 typically resides on a substrate 12. A bottom contact 14 and top contact 22 may be used to drive current through the conventional MTJ 10. The conventional MTJ, uses conventional seed layer(s) (not shown), may include capping layers (not shown) and may include a conventional antiferromagnetic (AFM) layer (not shown). The conventional magnetic junction 10 includes a conventional reference layer 16, a conventional tunneling barrier layer 18, and a conventional free layer 20. Also shown is top contact 22. Conventional bottom contact 14 and top contact 22 are used in driving the current in a current-perpendicular-to-plane (CPP) direction.

The conventional reference layer 16 and the conventional free layer 20 are magnetic. The magnetization 17 of the conventional reference layer 16 is fixed, or pinned, in a particular direction. The conventional reference layer 16 may be a multilayer such as a synthetic antiferromagnetic (SAF) layer including magnetic layers antiferromagnetically coupled through thin conductive layers, such as Ru. The conventional free layer 20 has a changeable magnetization 21. Although depicted as a simple layer, the conventional free layer 20 may also include multiple layers. The conventional reference layer 16 and free layer 20 may have their magnetizations 17 and 21, respectively oriented perpendicular to the plane of the layers.

In order to achieve perpendicular magnetic moments 17 and 21 and high magnetoresistance, various structures have been proposed. For example, alloys such as CoFeB and/or FeB may be used in the free layer 20 or reference layer 16. The inclusion of B allows the alloy to be amorphous as deposited. During fabrication, the reference layer 16 and/or free layer 20 generally undergoes one or more anneals. As a result, the boron tends to diffuse, leaving the CoFeB and FeB better crystallized and boron poor. In order to maintain the performance, the boron is desired to be removed not only from the layer being crystallized, but also the conventional magnetic junction 10. Some methods of doing so may damage the magnetic junction. As a result, the magnetoresistance of the magnetic junction 10 may be adversely affected. Accordingly, what is needed is a method and system that may improve the performance of the spin transfer torque based memories. The method and system described herein address such a need.

BRIEF SUMMARY OF THE INVENTION

A method provides a magnetic junction having a top and sides. A first magnetic layer, a nonmagnetic spacer layer and a second magnetic layer are deposited. The spacer layer is between the first and second magnetic layers. A free layer is one of the magnetic layers. A reference layer is the other of the magnetic layers. The second magnetic layer includes an amorphous magnetic layer having glass-forming nonmagnetic constituent(s). An anneal is performed in a gas having an affinity for the nonmagnetic constituent(s). The gas includes at least one of first and second gases. The first gas forms a gaseous compound with the nonmagnetic constituent(s). The second gas forms a solid compound with the nonmagnetic constituent(s). The second gas is usable if the anneal is performed after the magnetic junction has been defined. The solid compound is at least on the sides of the magnetic junction.

BRIEF DESCRIPTION OF SEVERAL VIEWS OF THE DRAWINGS

FIGS. 3-6 depict exemplary embodiments of a magnetic junction usable in a magnetic memory programmable using spin transfer torque and formed using a method that removes boron from the amorphous magnetic layer.

DETAILED DESCRIPTION OF THE INVENTION

Figure 1:
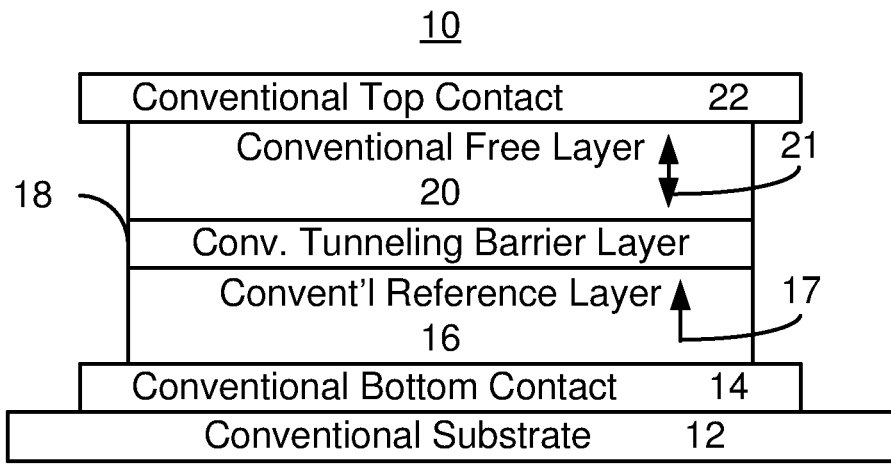
FIG. 1 depicts a conventional magnetic junction.

The exemplary embodiments relate to magnetic junctions usable in magnetic devices, such as magnetic memories, and the devices using such magnetic junctions. The magnetic memories may include spin transfer torque magnetic random access memories (STT-MRAMs) and may be used in electronic devices employing nonvolatile memory. Such electronic devices include but are not limited to cellular phones, smart phones, tables, laptops and other portable and non-portable computing devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations. Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or less components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

A method provides a magnetic junction having a top and sides. A first magnetic layer, a nonmagnetic spacer layer and a second magnetic layer are deposited. The spacer layer is between the first and second magnetic layers. A free layer is one of the magnetic layers. A reference layer is the other of the magnetic layers. The second magnetic layer includes an amorphous magnetic layer having nonmagnetic constituent(s) that are glass forming. An example of such a nonmagnetic constituent is B in a material such as CoFeB. An anneal is performed in a gas having an affinity for the nonmagnetic constituent(s). The gas includes at least one of first and second gases. The first gas forms a gaseous compound with the nonmagnetic constituent(s). The second gas forms a solid compound with the nonmagnetic constituent(s). The second gas is usable if the anneal is performed after the magnetic junction has been defined. The solid compound is at least on the sides of the magnetic junction.

The exemplary embodiments are described in the context of particular methods, magnetic junctions and magnetic memories having certain components. One of ordinary skill in the art will readily recognize that the present invention is consistent with the use of magnetic junctions and magnetic memories having other and/or additional components and/or other features not inconsistent with the present invention. The method and system are also described in the context of current understanding of the spin transfer phenomenon, of magnetic anisotropy, and other physical phenomenon. Consequently, one of ordinary skill in the art will readily recognize that theoretical explanations of the behavior of the method and system are made based upon this current understanding of spin transfer, magnetic anisotropy and other physical phenomena. However, the method and system described herein are not dependent upon a particular physical explanation. One of ordinary skill in the art will also readily recognize that the method and system are described in the context of a structure having a particular relationship to the substrate. However, one of ordinary skill in the art will readily recognize that the method and system are consistent with other structures. In addition, the method and system are described in the context of certain layers being synthetic and/or simple. However, one of ordinary skill in the art will readily recognize that the layers could have another structure. Furthermore, the method and system are described in the context of magnetic junctions and/or substructures having particular layers. However, one of ordinary skill in the art will readily recognize that magnetic junctions and/or substructures having additional and/or different layers not inconsistent with the method and system could also be used. Thus, as used herein, the term "magnetic" or "ferromagnetic" includes, but is not limited to ferromagnets and ferrimagnets. As used herein, "in-plane" is substantially within or parallel to the plane of one or more of the layers of a magnetic junction. Conversely, "perpendicular" and "perpendicular-to-plane" corresponds to a direction that is substantially perpendicular to one or more of the layers of the magnetic junction.

Figure 2:
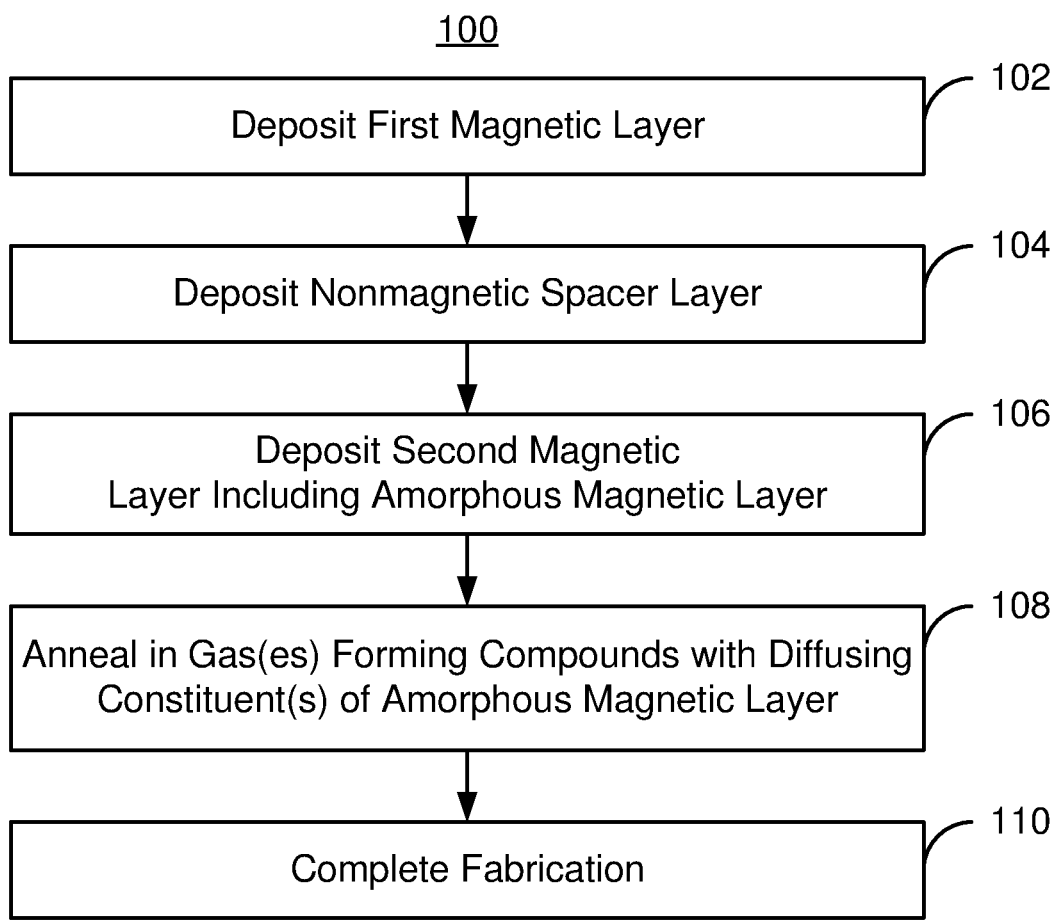
FIG. 2 flow chart depicting an exemplary embodiment of a method for providing a magnetic junction including at least one amorphous magnetic layer and removing boron from the amorphous magnetic layer.

FIG. 2 depicts an exemplary embodiment of a method 100 for fabricating a magnetic junction including at least one amorphous magnetic layer and removing a constituent of the amorphous magnetic layer during fabrication. The magnetic junction being formed is usable in a magnetic device such as a STT-RAM and, therefore, in a variety of electronic devices. Some steps may be omitted, performed in another order, combined and/or include substeps. Further, the method 100 may start after other steps in forming a magnetic memory have been performed. The method 100 is described in the context of fabricating a single magnetic junction. However, one of ordinary skill in the art may be that the method 100 is generally used to fabricate multiple magnetic junctions at substantially the same time.

A first magnetic layer is deposited, via step 102. The first magnetic layer formed in step 102 may have a perpendicular magnetic anisotropy (PMA) energy greater than its out-of-plane demagnetization energy. Consequently, the magnetic moment of the magnetic layer may be oriented perpendicular to plane. The magnetic layer deposited in step 102 may be a multilayer. In some embodiments, the magnetic layer may be a synthetic antiferromagnet (SAF) that includes two magnetically coupled ferromagnetic layers separated by a nonmagnetic coupling layer, such as Ru. The ferromagnetic layer(s) may be single layers or multilayers. In other embodiments, the magnetic layer deposited in step 102 may be a different multilayer. For example, the magnetic layer formed may be a Co/Pt or other multilayer having a high perpendicular anisotropy.

The first magnetic layer deposited in step 102 may, but need not, include amorphous magnetic layer(s), such as CoFeB and/or FeB. In such embodiments, an anneal may be performed to improve the crystallinity of the amorphous layer and remove the constituent that allows the layer to be amorphous as deposited. For CoFeB and/or FeB layers, at least some of the B may be removed. A CoFeB or FeB layer that is poorer in B and more crystalline than when deposited is formed. In some embodiments, the layer may be CoFe or Fe after B removal. Thus, an anneal analogous to the anneal described in step 108 may be performed as part of step 102. Alternatively, another mechanism may be employed to crystallize any amorphous magnetic layer in the first magnetic layer and remove B.

A nonmagnetic spacer layer is deposited, via step 104. Step 104 may include depositing an MgO layer to form a tunneling barrier layer. Thus, a crystalline MgO tunneling barrier layer having a (200) orientation may be formed. Step 104 may include performing an anneal to improve the crystal structure of the tunneling barrier layer. In other embodiments, the nonmagnetic spacer layer may be a conductor, another insulating tunneling barrier layer or have another structure and/or other materials.

A second magnetic layer is deposited, via step 106. Steps 102, 104 and 106 are carried out such that the nonmagnetic spacer layer is between the first magnetic layer and the second magnetic layer. In some embodiments, the steps 102, 104 and 106 are performed in order. Thus, the second magnetic layer is on top of the nonmagnetic spacer layer, which is on the first magnetic layer. In other embodiments, the steps are performed in the opposite order. Thus, in some embodiments, the second magnetic layer is closest to the substrate. However, in such an embodiment, the anneal discussed below in step 108 is performed before the nonmagnetic spacer layer and first magnetic layer are deposited in steps 102 and 104. The free layer and reference layer are formed from the first and second magnetic layers. Thus, if the free layer is formed using the first magnetic layer, then the reference layer includes the second magnetic layer. Alternatively, if the reference layer includes the first magnetic layer, then the free layer includes the second magnetic layer. The free layer formed using the method 100 may have a magnetic moment switchable between stable magnetic states when a write current is passed through the magnetic junction. Thus, the free layer may be programmable using spin transfer torque (STT).

The second magnetic layer deposited in step 106 includes an amorphous magnetic layer. In some embodiments, the second magnetic layer is a multilayer that includes the amorphous magnetic layer and one or more other layers. In other embodiments, the second magnetic layer may consist of only the amorphous magnetic layer. The amorphous magnetic layer includes at least one nonmagnetic constituent. The nonmagnetic constituent(s) aid in allowing the layer to be amorphous as opposed to crystalline. Stated differently, the nonmagnetic constituent(s) may be considered to be glass-forming constituents for the materials used in the amorphous magnetic layer. As used herein, an amorphous magnetic layer is amorphous as-deposited. After fabrication of the magnetic junction is complete, however, the magnetic layer may be partially or fully crystallized. In addition, some portion of the nonmagnetic constituent may be removed. For example, the amorphous magnetic layer may be a $(CoFe)_{1-x}B_x$ layer as deposited, where x is at least 0.2 and not more than 0.5. After completion of the magnetic junction, the amorphous magnetic layer may be B poor (x is less than 0.5 and not less than zero) and partially or fully crystalline (e.g. have a face-centered cubic crystal structure in at least prat of the layer). Note that the term CoFeB indicates a layer including CoFeB in the stoichiometry range above as-deposited. For the purposes of explanation, henceforth it is assumed that the nonmagnetic constituent of interest is B. However, in other embodiments, other glass-forming nonmagnetic constituents may be used in the amorphous magnetic layer.

An anneal of at least the second magnetic layer is performed, via step 108. If step 106 is performed after steps 102 and 104, then the first magnetic layer and nonmagnetic spacer layer are also subject to the anneal. If step 106 is performed before steps 102 and 104, then step 108 is also performed before steps 102 and 104. Thus, the second magnetic layer is subject to the anneal, but the first magnetic layer would not be. The anneal of step 108 may be used to at least partially crystallize the amorphous magnetic layer. Thus, the anneal may be performed at a temperature above room temperature. For example, the anneal temperature may be at least two hundred degrees Celsius and not more than five hundred degrees Celsius. In some such embodiments, the anneal temperature is at least three hundred degrees Celsius. For example, the anneal may be nominally at three hundred or three hundred and fifty degrees Celsius. In other embodiments, other anneal temperatures may be used. The anneal of step 108 may be a rapid thermal anneal (RTA). Thus, the amorphous magnetic layer may become at least partially crystalline. As part of this process, B may diffuse. For example, B may travel toward the exposed surface of the amorphous magnetic layer.

The anneal for step 108 is performed in one or more gases. In some embodiments, a plasma is formed by the gas(es). Thus, the anneal may be in this plasma or simply in the selected gas(es). At least some of the gas(es) used in step 108 have an affinity for the nonmagnetic constituent(s). These gas(es) used in step 108 tend to form a compound with the B of the amorphous magnetic layer. Thus, the gas(es) have a negative binding energy with B. In some embodiments, the gas(es) form a gaseous compound with B. For example, one or more of $CHF_3$, $CF_4$, $SF_6$, $CF_3Cl$, $NF_3$, F, Cl, H, O and N gas may be used. The gaseous compounds formed may be $BF_3$, $BH_3$ and/or $BCl_3$. Other gaseous compounds might also be formed and/or other gases may be used. The gaseous compounds formed in step 108 may simply be pumped away during the anneal. Thus, the B may be simply and easily removed.

In other embodiments, the gas(es) used in the anneal form a solid compound with B. For example, compounds such as BO, BN, BS, BC, BP, BSi and/or BaAl may be formed. In such embodiments, gases such as O, N, or other gases including O, N, S, C, P, Si and/or Al may be used. In such an embodiment, the anneal for step 108 is performed after the magnetic junction has been defined, for example via an ion mill. In still other embodiments, a mixture of gases may be used such that solid and gaseous compounds are formed with B.

Fabrication of the magnetic junction is completed, via step 110. In some embodiments, step 110 includes removing the solid compound that includes B from at least the top of the magnetic junction. This may be accomplished using a chemical mechanical planarization (CMP). Thus, electrical connection may be made to the magnetic junction. In some cases, the solid compound is removed from the sides of the magnetic junction. However, in other embodiments, the solid compound is allowed to remain on the sides of the magnetic junction as an encapsulating layer.

Using the method 100, the magnetic junction having improved performance may be formed. The amorphous magnetic layer, which may provide a high magnetoresistance and improved spin transfer after annealing, is provided. Some or all of the B in this layer may be removed more easily and without damaging the magnetic layer Magnetoresistance, such as tunneling magnetoresistance (TMR) may be preserved. Thus, performance of the magnetic junction formed using the method 100 may be improved.

FIG. 3 depicts an exemplary embodiment of a magnetic junction 200 that is formed using the method 100. The magnetic junction 200 is usable in a magnetic memory programmable utilizing spin transfer. For clarity, FIG. 3 is not to scale. The magnetic junction 200 may be used in a magnetic device such as a STT-RAM and, therefore, in a variety of electronic devices. Also shown is an underlying substrate 201 in which devices including but not limited to a transistor may be formed. Optional seed layer(s) 204 are also shown.

The magnetic junction 200 includes a first magnetic layer 210 that may be formed using step 102, a nonmagnetic spacer layer 220 formed using step 104, and a second magnetic layer 230 formed using step 106. Thus, the steps 102, 104 and 106 are performed in order to provide the magnetic junction 200. The first magnetic layer 110 may be a single layer or a multilayer. In some embodiments, the first magnetic layer 210 is the free layer for the magnetic junction 200. In such embodiments, the second magnetic layer 230 is the reference layer. Alternatively, the first magnetic layer 210 is the reference layer. In such embodiments, the second magnetic layer 230 is the free layer. In the embodiment shown, the second magnetic layer includes the amorphous magnetic layer 234. Although termed amorphous, the amorphous magnetic layer 234 may be partially or fully crystallized. Optional additional layer(s) 232 may also be part of the second magnetic layer 230. The magnetic junction 200 may have the benefits described above for the method 100.

FIG. 4 depicts an exemplary embodiment of a magnetic junction 200' that is formed using the method 100. The magnetic junction 200' is usable in a magnetic memory programmable utilizing spin transfer. For clarity, FIG. 4 is not to scale. The magnetic junction 200' may be used in a magnetic device such as a STT-RAM and, therefore, in a variety of electronic devices. Also shown is an underlying substrate 201 in which devices including but not limited to a transistor may be formed. Optional seed layer(s) 204 are also shown. The magnetic junction 200' is analogous to the magnetic junction 200 and thus has similar components with analogous labels. The magnetic junction 200' thus includes a first magnetic layer 210, a nonmagnetic spacer layer 220 and a second magnetic layer 230 that are analogous to the layers 210, 220 and 230 in FIG. 3, respectively.

In addition, the magnetic junction 200' includes optional additional layer(s) 240. These layer may include capping, antiferromagnetic (AFM), magnetic or other layers deposited after the anneal in step 108. Thus, although the second magnetic layer 230 is generally desired to have its top surface exposed for the anneal in step 108, other layers may be formed on the second magnetic layer 230 after step 108 is performed. Like the magnetic junction 200, the magnetic junction 200' may have the benefits described above for the method 100.

Figure 5:
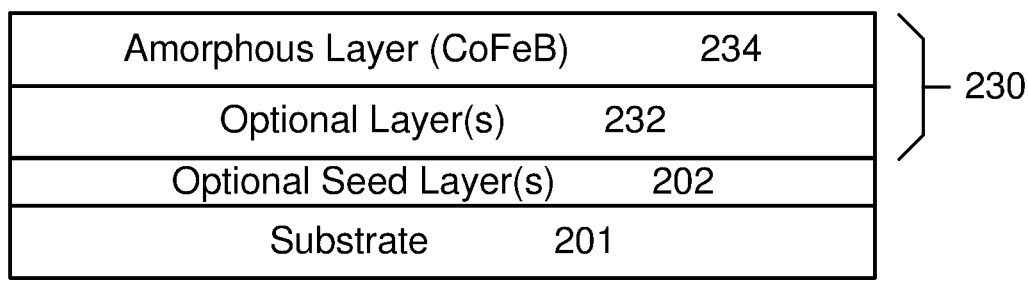
Figure 6:
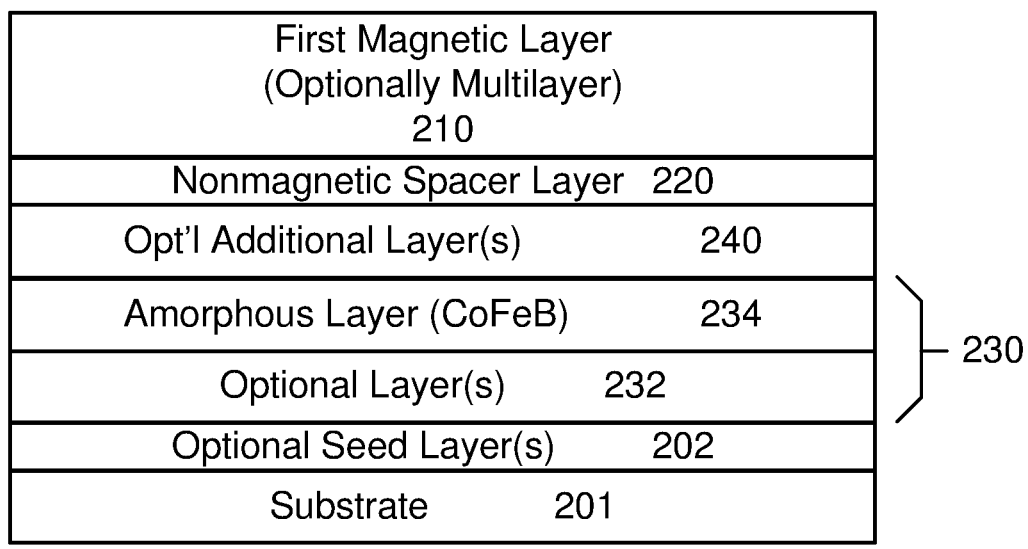

FIGS. 5-6 depict an exemplary embodiment of a magnetic junction 200" during fabrication using the method 100. The magnetic junction 200" is usable in a magnetic memory programmable utilizing spin transfer. For clarity, FIGS. 5-6 are not to scale. The magnetic junction 200" may be used in a magnetic device such as a STT-RAM and, therefore, in a variety of electronic devices. Also shown is an underlying substrate 201 in which devices including but not limited to a transistor may be formed. Optional seed layer(s) 204 are also shown.

FIG. 5 depicts the magnetic junction 200" after step 106 has been performed, but before steps 102 and 104 have been carried out. Thus, the second magnetic layer 230 is shown. The anneal in step 108 may have been performed for the magnetic junction 200" in FIG. 5. Thus although labeled as an amorphous magnetic layer, the layer 234 may be partially or fully crystalline and boron poor. FIG. 6 depicts the magnetic junction 200" after steps 102 and 104 have been performed. Thus, the nonmagnetic spacer layer 220 and first magnetic layer 210 have been fabricated. Optional additional layer(s) 240 are also shown. Thus, the second magnetic layer 230 including the amorphous magnetic layer 234 need not be at the top of the finished magnetic junction 200". Instead, the top surface of the amorphous magnetic layer 234 may be exposed for the anneal, then covered by subsequent layers. Like the magnetic junctions 200 and 200', the magnetic junction 200" may have the benefits described above for the method 100.

Figure 7:
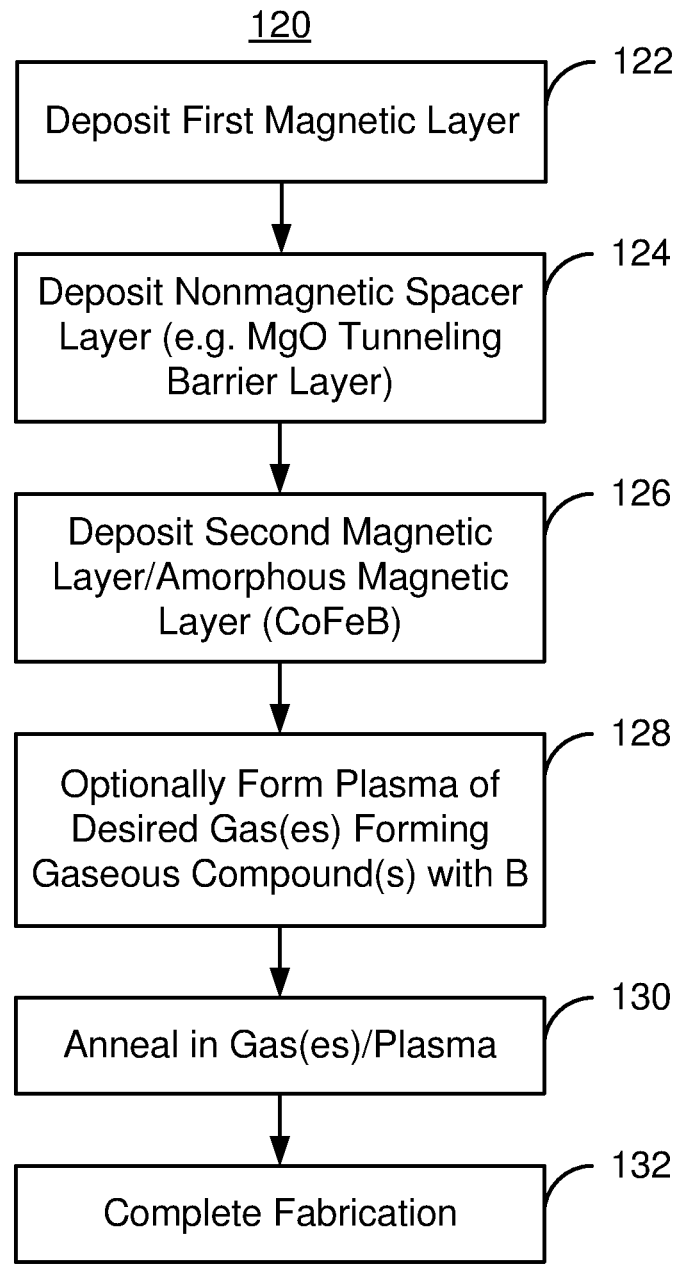
FIG. 7 flow chart depicting exemplary embodiment of a method for providing a magnetic junction including at least one amorphous magnetic layer and removing boron from the amorphous magnetic layer.

FIG. 7 depicts an exemplary embodiment of a method 120 for fabricating a magnetic junction having an amorphous magnetic layer from which a nonmagnetic constituent such as B is removed. The magnetic junction being formed is usable in a magnetic device such as a STT-RAM and, therefore, in a variety of electronic devices. For simplicity, some steps may be omitted, performed in another order, include substeps or combined. Further, the method 120 may start after other steps in forming a magnetic memory have been performed. FIGS. 8-11 depict exemplary embodiments of magnetic memories 300 and 300' during fabrication using the method 120. FIGS. 8-11 are not to scale. Referring to FIGS. 7-11, the method 120 is described in the context of the magnetic memories 300 and 300'. However, other magnetic memories may be formed. The method 120 is also described in the context of the second magnetic layer consisting of the amorphous magnetic layer and being deposited after the first magnetic layer. In other embodiments, however, the second magnetic layer and anneal described below may be formed before the first magnetic layer and nonmagnetic spacer layer. Also in other embodiments, the second magnetic layer may include other layers.

A first magnetic layer is deposited, via step 122. Step 122 may include depositing a single layer or a multilayer. The first magnetic layer may form the free layer or the reference layer. Further, the first magnetic layer may have a PMA greater than its out-of-plane demagnetization energy.

A nonmagnetic spacer layer is provided, via step 124. Step 124 may include forming an MgO layer to form a tunneling barrier layer.

Figure 8:
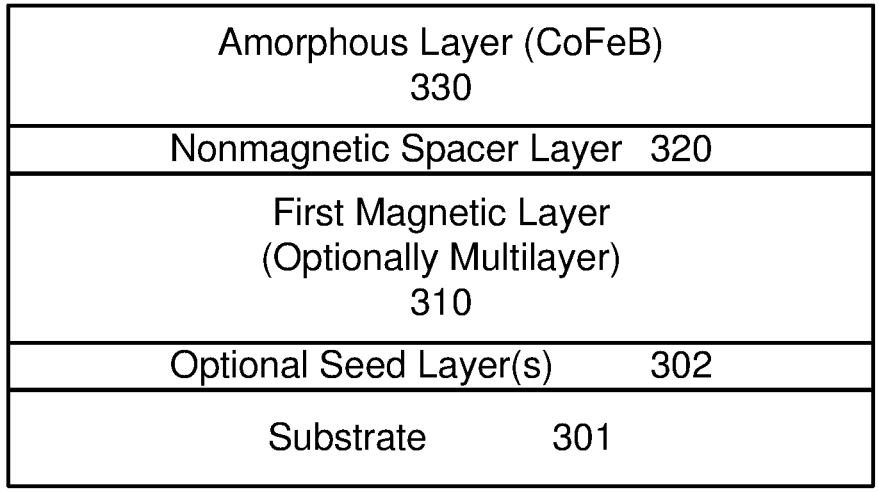
FIGS. 8-11 depict exemplary embodiments of a magnetic junction usable in a magnetic memory programmable using spin transfer torque during formation using a method that removes boron from an amorphous magnetic layer included in the magnetic junction.

The second magnetic layer is deposited, via step 126. The second magnetic layer is an amorphous magnetic layer, such as CoFeB. Thus, the method 120 is described in the context of a CoFeB layer. The second magnetic layer may be part or all of a reference layer or a free layer. FIG. 8 depicts the magnetic memory 300 after step 126 is performed. Thus, the first magnetic layer 310, nonmagnetic spacer layer 320 and CoFeB (amorphous magnetic) layer 330 are shown. Also depicted are the underlying substrate 301 and seed layer(s) 302. The layers 310, 320 and 330 are analogous to the layers 210, 220 and 230/234 described above.

A plasma is optionally formed in the chamber in which the magnetic memory 300 is annealed, via step 128. In other embodiments, step 128 may be omitted. Thus, an anneal in the method 120 may be carried out in a plasma or simply in the desired gas(es). The gases selected for the plasma of step 128 and the anneal in step 130 form a gaseous compound with the B in the CoFeB layer. For example, one or more of $CHF_3$, $CF_4$, $SF_6$, $CF_3Cl$, $NF_3$, F, Cl, H, O and N gas may be used. The gaseous compounds formed may be $BF_3$, $BH_3$ and/or $BCl_3$. Alternatively, other gases forming other compounds with the B may be used.

Figure 9:
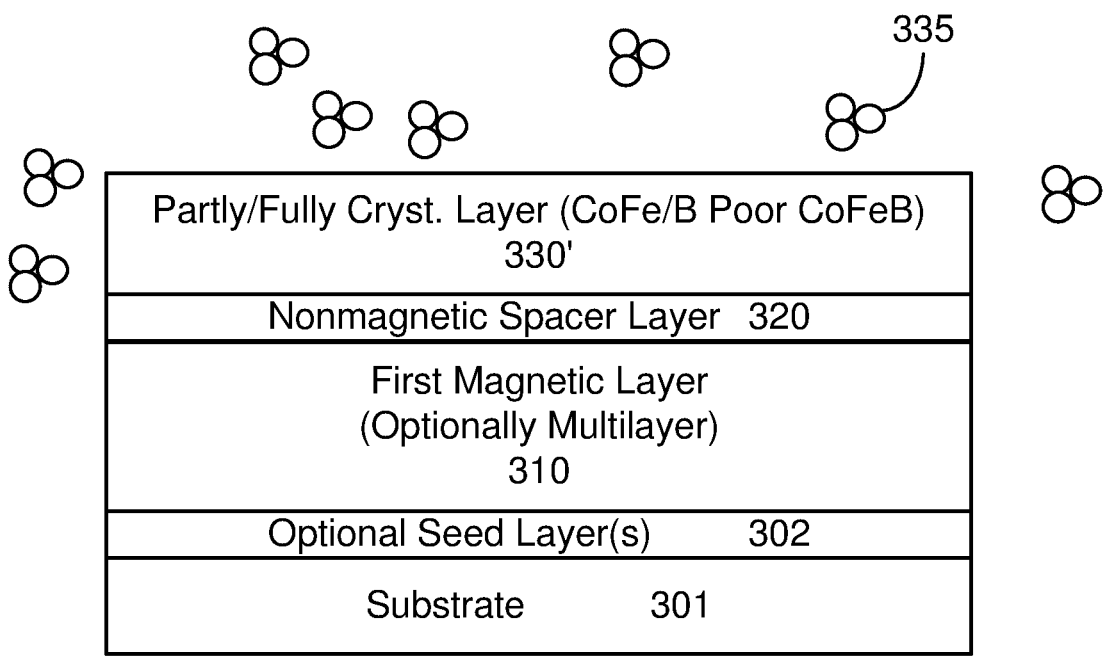

An anneal is performed, via step 130. The anneal of step 130 may partially crystallize or fully the amorphous magnetic layer 330. The anneal may be in the temperature ranges described above and may be an RTA. FIG. 9 depicts the magnetic memory 300 during the anneal. Thus, the magnetic memory 300 is at an elevated temperature. Also shown are gaseous compounds 335, of which only one is labeled. The CoFeB layer 330' may be partially or fully crystallized by the anneal. For example, the CoFeB layer 330' may have less B than the CoFeB layer 330 of FIG. 8. In some embodiments, all of the B in the layer 330' has diffused to the surfaces and formed gaseous compound(s) 335. Thus, the layer 330' may be a CoFe layer. Because gaseous compound 335 is formed, the B may simply be pumped away with the remaining gas (not explicitly shown in FIG. 9). Thus, the B may be simply and easily removed from the amorphous magnetic layer 330, leaving partially or fully crystallized layer 330'.

Figure 10:
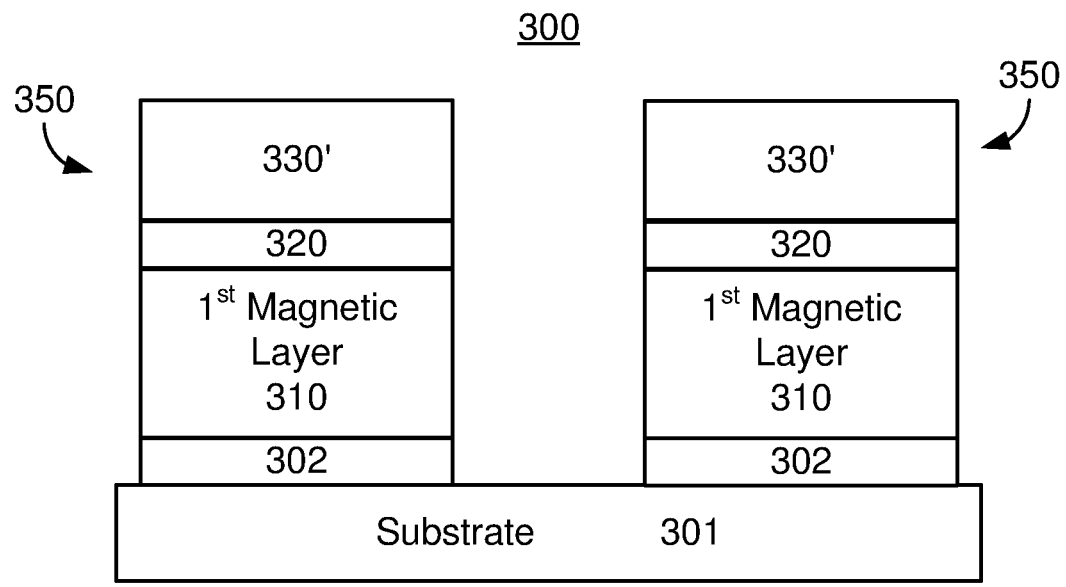
Figure 11:
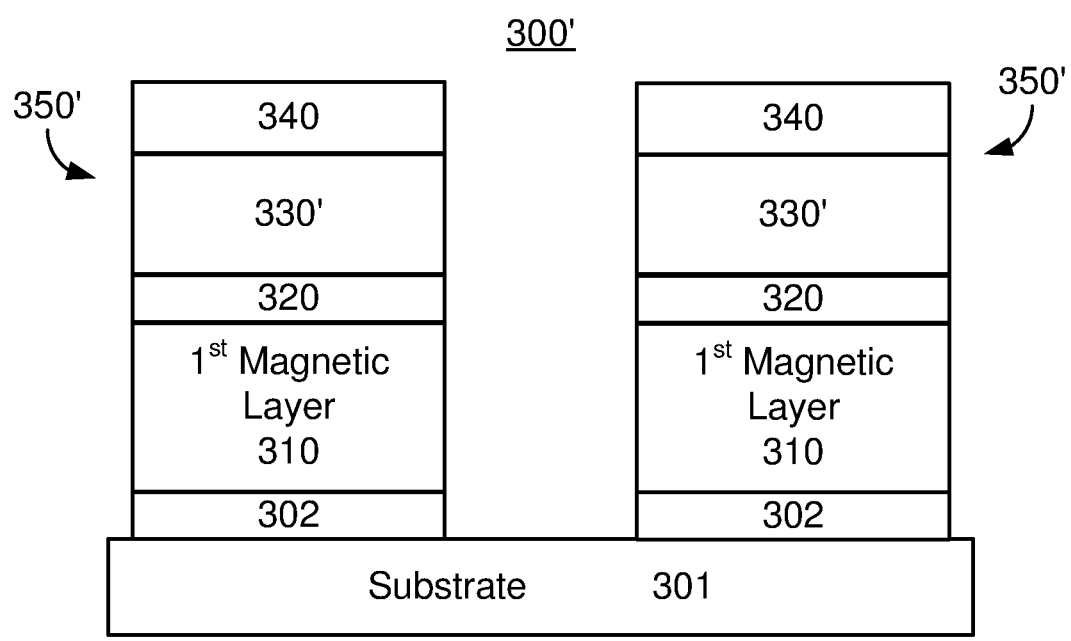

Fabrication of the magnetic memory 300 may be completed. For example, a mask may be provided. The mask covers the regions desired to form magnetic junctions and has apertures over other remaining regions. A removal step such as an ion mill is then performed. FIG. 10 depicts the magnetic memory 300 after such a step is performed. Thus, individual magnetic junctions 350 have been formed. In some embodiments, additional layers may be provided before or after the magnetic junctions 350 are defined. For example, FIG. 11 depicts a magnetic memory 300' in which the magnetic junctions 350 include one or more additional layers 340. The regions between the magnetic junctions 350/350' may be refilled and other portions of the magnetic memory 300/300' may be fabricated.

Thus, using the method 120, a magnetic memory 300/300' having improved/crystallized magnetic layers 330/330' may be formed. As a result, the desired magnetic properties, such as PMA and magnetoresistance, may be achieved. This may be accomplished by a relatively easy removal of the B-containing gaseous compounds formed during the anneal. As a result, fabrication and performance of the magnetic memories 300 and 300' may be improved.

Figure 12:
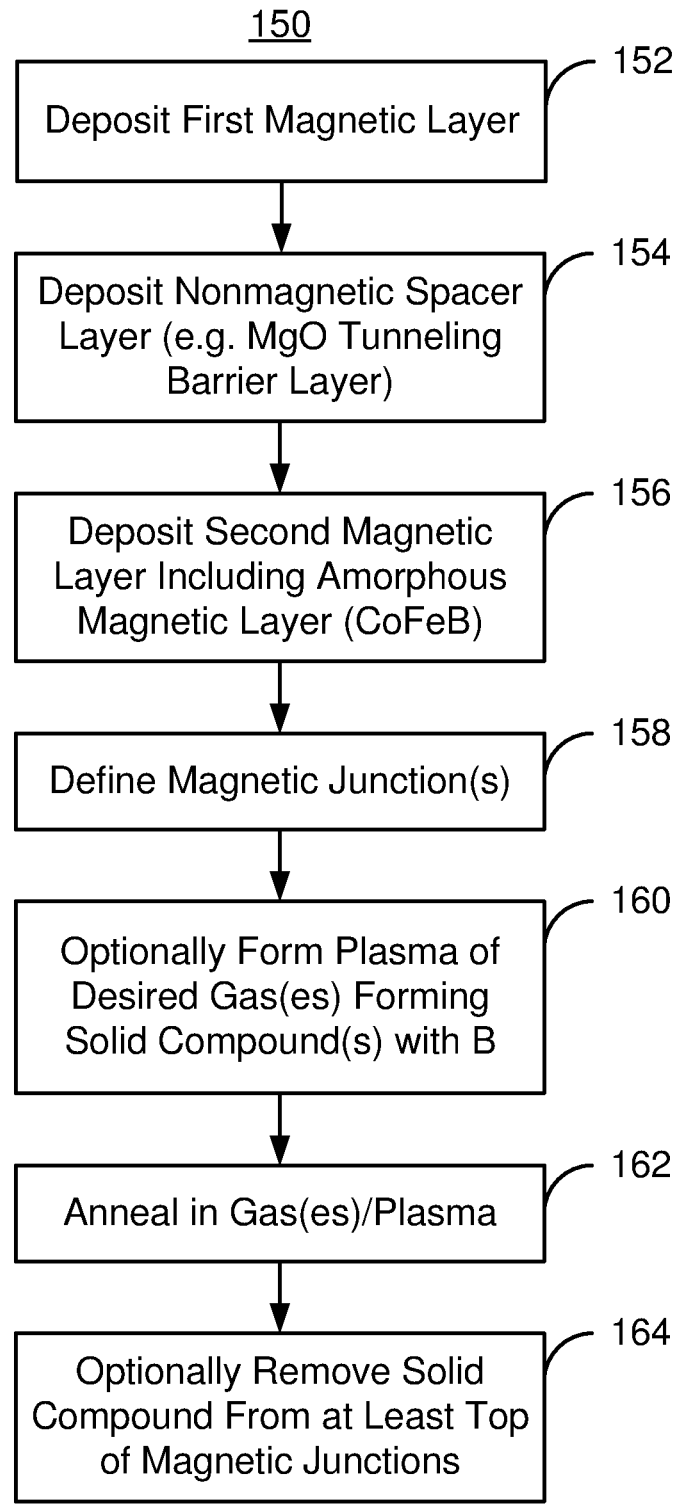
FIG. 12 flow chart depicting exemplary embodiment of a method for providing a magnetic junction including at least one amorphous magnetic layer and removing boron from the amorphous magnetic layer.

FIG. 12 depicts an exemplary embodiment of a method 150 for fabricating a magnetic junction having an amorphous magnetic layer from which a nonmagnetic constituent such as B is removed. The magnetic junction being formed is usable in a magnetic device such as a STT-RAM and, therefore, in a variety of electronic devices. For simplicity, some steps may be omitted, performed in another order, include substeps or combined. Further, the method 150 may start after other steps in forming a magnetic memory have been performed. FIGS. 13-16 depict exemplary embodiments of magnetic memories 400 and 400' during fabrication using the method 150. FIGS. 13-16 are not to scale. Referring to FIGS. 12-16, the method 150 is described in the context of the magnetic memories 400 and 400'. However, other magnetic memories may be formed. The method 150 is also described in the context of the second magnetic layer consisting of the amorphous magnetic layer and being deposited after the first magnetic layer. In other embodiments, however, the second magnetic layer and anneal described below may be formed before the first magnetic layer and nonmagnetic spacer layer. Also in other embodiments, the second magnetic layer may include other layers.

A first magnetic layer is deposited, via step 152. Step 152 may include depositing a single layer or a multilayer. The first magnetic layer may form part or all of the free layer or the reference layer. Further, the first magnetic layer may have a PMA greater than its out-of-plane demagnetization energy.

A nonmagnetic spacer layer is provided, via step 154. Step 154 may include forming an MgO layer to form a tunneling barrier layer.

The second magnetic layer is deposited, via step 156. The second magnetic layer is an amorphous magnetic layer, such as CoFeB. Thus, the method 150 is described in the context of a CoFeB layer.

Figure 13:
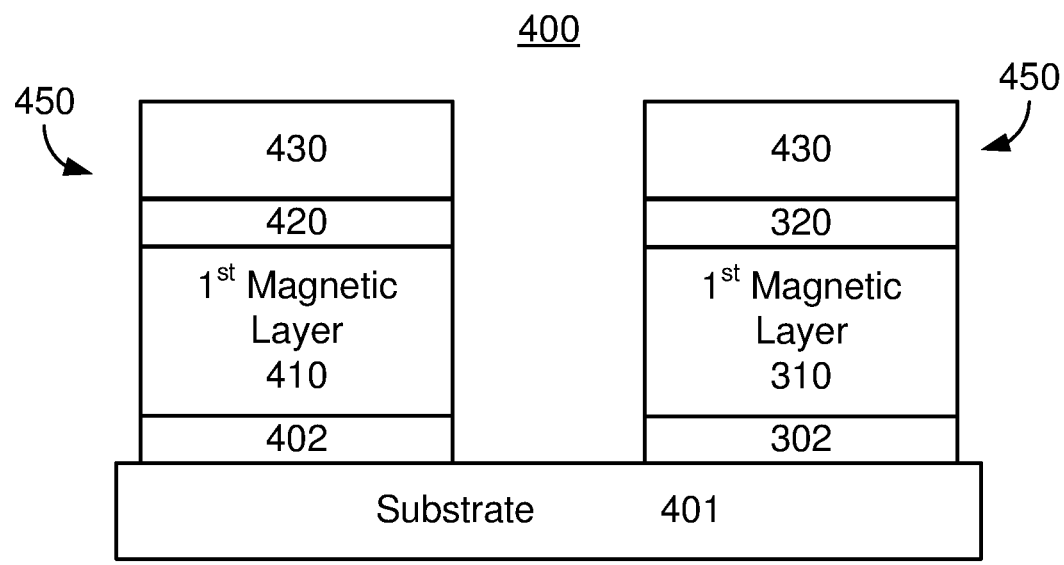
FIGS. 13-16 depict exemplary embodiments of a magnetic junction usable in a magnetic memory programmable using spin transfer torque during formation using a method that removes boron from an amorphous magnetic layer included in the magnetic junction.

The magnetic junctions are defined from the layer provided, via step 158. For example, step 158 may include providing a mask. The mask covers the regions desired to form magnetic junctions and has apertures over other remaining regions. A removal step such as an ion mill is also performed in step 158. FIG. 13 depicts the magnetic memory 400 after step 158 is performed. Thus, the first magnetic layer 410, nonmagnetic spacer layer 420 and CoFeB (amorphous magnetic) layer 430 are shown. Also depicted are the underlying substrate 401 and seed layer(s) 402. The layers 410, 420 and 430 are analogous to the layers 210, 220 and 230/234 described above. In addition, individual magnetic junctions 450 have been formed.

A plasma is optionally formed in the chamber in which the magnetic memory 400 is annealed, via step 160. In other embodiments, step 160 may be omitted. Thus, an anneal in the method 150 may be carried out in a plasma or simply in the desired gas(es). The gases selected for the plasma of step 160 and the anneal in step 162 form a solid compound with the B in the CoFeB layer. For example, the gaseous compounds formed may include one or more of BO, BN, BS, BC, BP, BSi and/or BaAl. In such embodiments, gases such as O, N, or other gases including O, N, S, C, P, Si and/or Al may be used.

Figure 14:
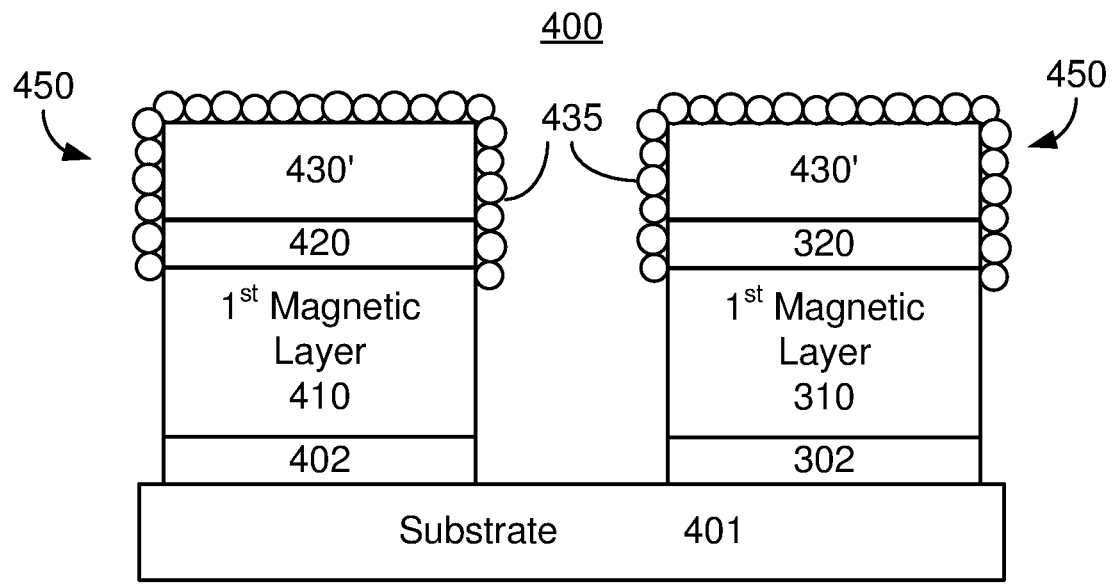

An anneal is performed, via step 162. The anneal of step 162 may partially crystallize or fully the amorphous magnetic layer 430. The anneal may be in the temperature ranges described above and may be an RTA. FIG. 14 depicts the magnetic memory 400 during the anneal. Thus, the magnetic memory 400 is at an elevated temperature. Also shown are solid compounds 435, of which only some are labeled. In some cases, these solid compounds 435 may form a layer on the top and sides of at least the CoFeB layer 330'. In other cases, the layer of solid compounds 435 may extend different amounts along the sides of the magnetic junctions 450. The CoFeB layer 430' may be partially or fully crystallized by the anneal. For example, the CoFeB layer 430' may have less B than the CoFeB layer 430 of FIG. 13. In some embodiments, all of the B in the layer 430' has diffused to the surfaces and formed solid compound(s) 435. Thus, the layer 430' may be a CoFe layer. Thus, the B may be removed from the amorphous magnetic layer 430, leaving partially or fully crystallized layer 430'.

Figure 15:
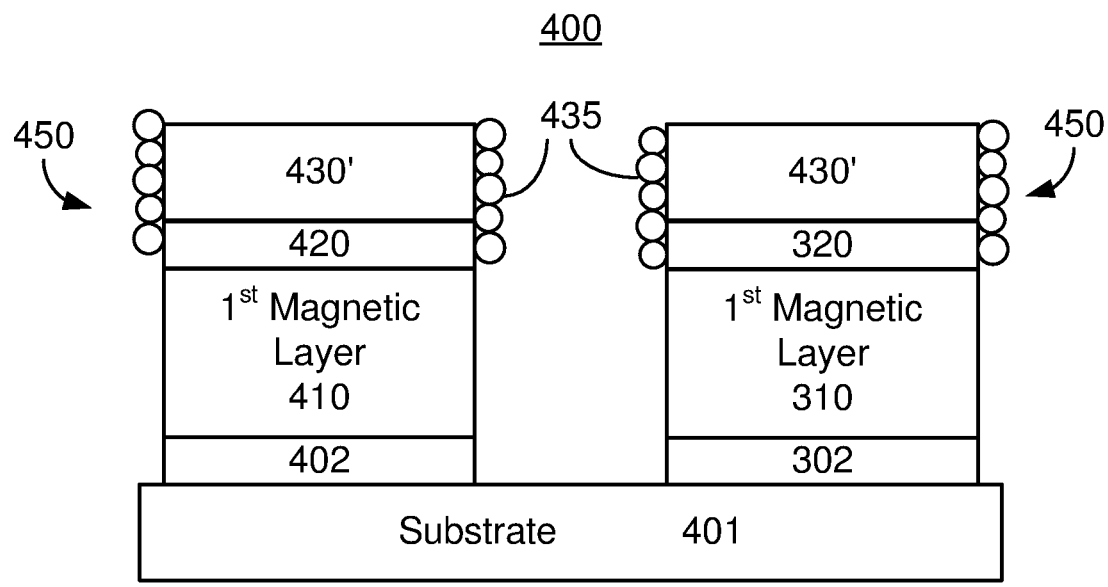
Figure 16:
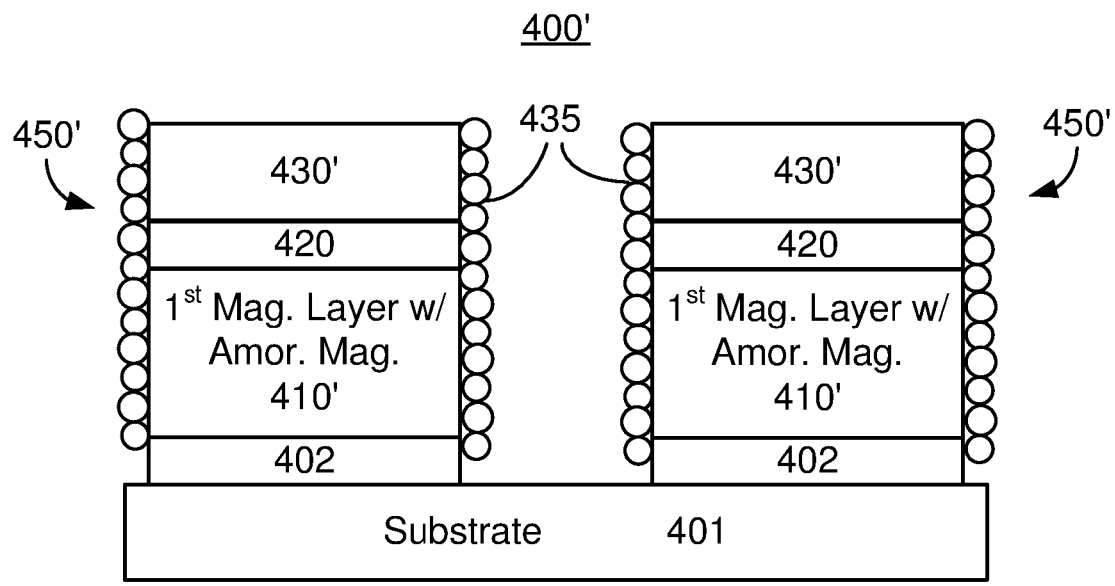

The solid compounds 435 may optionally be removed from the tops of the magnetic junctions 250, via step 164. Step 164 may be accomplished using a CMP. FIG. 15 depicts the magnetic memory 400 after step 164 has been performed. Thus, the top surface of the top layer 430' has been exposed. Although not shown in FIG. 15, an insulating refill layer (not shown in FIG. 15) may be provided before performing the CMP. In some embodiments, the anneal of step 162 (and 160) may also be performed for the first magnetic layer. The first magnetic layer 410 may also include an amorphous magnetic layer. If so, the solid compound may extend further along the sides of the magnetic junctions. FIG. 16 depicts an exemplary embodiment of a memory 400' in which the first magnetic layer 410' and the second magnetic layer 430' include B and are amorphous as-deposited. The memory 400' is shown after both anneals. Thus, the solid compound 435 may extend further along the sides of the magnetic junctions 450. Thus, an encapsulating layer may be provided by the anneal.

Thus, using the method 150, a magnetic memory 400/400' having improved/crystallized magnetic layers 430/430' may be formed. As a result, the desired magnetic properties, such as PMA and magnetoresistance, may be achieved. As a result, fabrication and performance of the magnetic memories 300 and 300' may be improved.

A method and system for providing a magnetic junction and a memory fabricated using the magnetic junction has been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A method for providing a magnetic junction residing on a substrate and usable in a magnetic device, the magnetic junction including a top and a plurality of sides, the method comprising:
    depositing a first magnetic layer;
    depositing a nonmagnetic spacer layer;
    depositing a second magnetic layer, the nonmagnetic spacer layer being between the first magnetic layer and the second magnetic layer, a free layer being one of the first magnetic layer and the second magnetic layer, a reference layer being an other of the first magnetic layer and the second magnetic layer, the free layer having a magnetic moment switchable between a plurality of stable magnetic states when a write current is passed through the magnetic junction, the second magnetic layer including an amorphous magnetic layer having at least one nonmagnetic constituent, the at least one nonmagnetic constituent being glass-forming; and
    performing an anneal in a gas having an affinity for the at least one nonmagnetic constituent, the gas including at least one of a first gas and a second gas, the first gas forming a gaseous compound with the at least one nonmagnetic constituent, the second gas forming a solid compound with the at least one nonmagnetic constituent, the second gas being usable in the anneal performed after the magnetic junction has been defined, the solid compound residing at least on the plurality of sides of the magnetic junction.

2. The method of claim 1 wherein the at least one nonmagnetic constituent is B.

3. The method of claim 2 wherein the gaseous compound includes at least one of $BF_3$, $BH_3$ and $BCl_3$.

4. The method of claim 2 wherein the first gas includes at least one of $CHF_3$, $CF_4$, $SF_6$, $CF_3Cl$, $NF_3$, F, Cl, H, O and N.

5. The method of claim 2 wherein the step of performing the anneal further includes:
    forming a plasma using the gas.

6. The method of claim 1 wherein the solid compound includes at least one of BO, BN, BS, BC, BP, BSi and BAl.

7. The method of claim 6 wherein the magnetic junction includes a top and wherein the method further includes:
    removing the solid compound from the top of the magnetic junction.

8. The method of claim 1 wherein the amorphous magnetic layer includes CoFeB.

9. The method of claim 8 wherein the second magnetic layer consists of the amorphous magnetic layer.

10. The method of claim 1 wherein the first magnetic layer is between the second magnetic layer and the substrate.

11. The method of claim 1 wherein the second magnetic layer is between the first magnetic layer and the substrate.

12. The method of claim 1 further comprising:
    providing at least one additional layer on the second magnetic layer.

13. A method for providing a magnetic junction residing on a substrate and usable in a magnetic device, the method comprising:
    depositing a first magnetic layer;
    depositing a nonmagnetic spacer layer;
    depositing a second magnetic layer, the nonmagnetic spacer layer being between the first magnetic layer and the second magnetic layer, a free layer being one of the first magnetic layer and the second magnetic layer, a reference layer being an other of the first magnetic layer and the second magnetic layer, the second magnetic layer including a CoFeB layer;
    defining the magnetic junction from the first magnetic layer, the second magnetic layer and the nonmagnetic spacer layer, the magnetic junction including a top and a plurality of sides; and
    performing an anneal in a gas having an affinity for B after the step of defining the magnetic junction, the gas forming a solid compound with the B, the solid compound residing at least on the plurality of sides of the magnetic junction.

14. The method of claim 13 wherein the solid compound includes at least one of BO, BN, BS, BC, BP, BSi and BAl.

15. The method of claim 14 wherein the solid compound resides on the top of the magnetic junction, the method further comprising:
    removing the solid compound from the top of the magnetic junction.

* * * * *